United States Patent
Huang et al.

(10) Patent No.: US 6,643,170 B2
(45) Date of Patent: Nov. 4, 2003

(54) METHOD FOR OPERATING A MULTI-LEVEL MEMORY CELL

(75) Inventors: Jen-Ren Huang, Tainan (TW); Ming-Hung Chou, Miaoli Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/990,396

(22) Filed: Nov. 20, 2001

(65) Prior Publication Data

US 2003/0076709 A1 Apr. 24, 2003

(30) Foreign Application Priority Data

Oct. 24, 2001 (TW) .................................. 90126237 A

(51) Int. Cl.[7] .............................................. G11C 16/04
(52) U.S. Cl. ......................... 365/185.03; 365/185.01; 365/185.18; 365/185.24; 365/185.26; 365/185.28
(58) Field of Search ..................... 365/185.03, 185.01, 365/185.18, 185.24, 185.26, 185.28

(56) References Cited

U.S. PATENT DOCUMENTS 6,269,023 B1 * 7/2001 Derhacobian et al. . 365/185.24
6,320,786 B1 * 11/2001 Change et al. ......... 365/185.03
6,396,741 B1 * 5/2002 Bloom et al. .......... 365/185.22

* cited by examiner

Primary Examiner—David Nelms
Assistant Examiner—Connie C. Yoha
(74) Attorney, Agent, or Firm—J. C. Patents

(57) ABSTRACT

A method for operating a memory cell of a multi-level NROM is described. The memory cell of the multi-level NROM comprises a nitride layer, wherein the nitride layer comprises a plurality of charge-trapping regions to store locally a plurality of charges as the first bit memory and the second bit of memory. The stored charges of the second bit of memory forms an electrical barrier, which in turns affects the size of the threshold electric current of the first bit. The different threshold electrical currents of the first bit, which are affected by the size of the electrical barrier, define the various memory states of the memory cell of the multi-level NROM.

5 Claims, 4 Drawing Sheets

METHOD FOR OPERATING A MULTI-LEVEL MEMORY CELL

CROSS-REFERENCE TO RELATED APPLICATION

This application claims the priority benefit of Taiwan application serial no. 90126237, filed on Oct. 24, 2001.

BACK GROUNDING OF THE INVENTION

1. Field of Invention

The present invention relates to a method for operating a multi-level memory. More particularly, the present invention relates to a method for operating a silicon nitride read-only memory (NROM).

2. Description of Related Art

The threshold voltage characteristic of an erasable and programmable read-only memory (EPROM), an electrical erasable and programmable read-only memory (EEPROM) and a flash memory is controlled by the total charges that are retained in the floating gate. A memory cell uses different threshold voltage ranges to define the various threshold voltage levels. Every level of the threshold voltage defines a different memory state of a multi-level memory cell.

FIG. 1 is a cross-sectional view showing the memory cell of a flash memory device according to the prior art. As shown in FIG. 1, a gate structure 102 includes, sequentially from bottom to top, an oxide layer 108, a polysilicon layer as the floating gate 104, an oxide layer 110, a nitride layer 112, an oxide layer 114 and a polysilicon layer as the control gate 106. The floating gate 104 is in a "floating state", which is not connected with any line and is used for charge storage. The control gate 106 controls the storage and retrieval of information. The formation of the gate structure 102 thus requires a multiple of masking processes. Moreover, an additional voltage is applied to the control gate during the programming of the flash memory device 100 to provide the bias that is required for the programming of the flash memory device 100.

The aforementioned flash memory 100 (as shown in FIG. 1) typically can store a single bit of data, for example, a logic "0" state or a logic "1" state. FIG. 2 is a diagram illustrating the method for detecting the logic "0" state or the logic "1" state by a memory cell. During a reading operation, a voltage $V_{read}$ is applied to the gate. If the voltage $V_{read}$ is smaller than the threshold voltage Vt, no current would travel through the source region and the drain region of the memory cell, and a logic state of "0" is determined. If the voltage $V_{read}$ is greater than the threshold voltage Vt, a large current would travel through the source region and the drain region of the memory cell to determine a logic state of "1".

The development of the high-density flash memory cell provides four memory states in a single bit of memory. FIG. 4 illustrates the distribution of the three threshold voltages (Vt1, Vt2, Vt3) of a memory cell of a high density flash memory device. Similar to the conventional memory that stores a single bit of memory, a voltage $V_{read}$ is applied to the gate during the reading of a memory cell. If $V_{read}$ is less than Vt1, a current is traveled through the source region and the drain region of the memory device to determine a logic state of "00". If $V_{read}$ is greater than Vt1 but is less than Vt2, as in FIG. 3, a higher current would travel through the source region and the drain region of the memory cell to determine a logic state of "01". The logic state of "10" is determined if the $V_{read}$ voltage is between the threshold voltage Vt2 and Vt3 and the logic state "11" is determined if the $V_{read}$ voltage is higher than Vt3, respectively.

Referring again to FIG. 1, an additional voltage is applied to the control gate during the programming of the flash memory device 100 to provide the bias that is required for the programming of the flash memory device 100. In order to reduce the bias that is required for the programming of the flash memory device 100, an additional polysilicon layer is formed between the oxide layer 108 and the floating gate 104 to increase the coupling ratio of the floating gate 104 and to reduce the required bias during the programming of the flash memory device 100. An additional ion implantation process (as illustrated by the slanted line region 120 in FIG. 1) may also performed in the regions near the source region 118 and the drain region 116, respectively. The additional ion implantation would increase the erasure capability of the flash memory device 100. The additional implantation process, however, would complicate the semiconductor processing and increase the production cost.

SUMMARY OF THE INVENTION

The present invention provides a method for programming a multi-level memory cell. When a NROM structure is used to fabricate the multi-level memory cell, it only requires fixing the bias and reading one side of a bit. The fabricating method of the present invention to form a multi-level memory cell is to simplify the semiconductor processing so that, the production cost is reduced.

The present invention provides a method for programming a multi-level NROM cell. The multi-level NROM cell comprises a silicon nitride layer, wherein the silicon nitride layer can locally trap a plurality of charges to form a plurality of charge trapping regions. The charges stored in these charge-trapping regions are the first bit of memory and a second bit of memory, respectively. The charges that are stored in the trapping region as the second bit of memory form an electrical barrier. The level of the threshold current depends on the size of the electrical barrier. The different levels of the threshold currents are thereby used to define the different memory states of the multi-level NROM memory cell.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
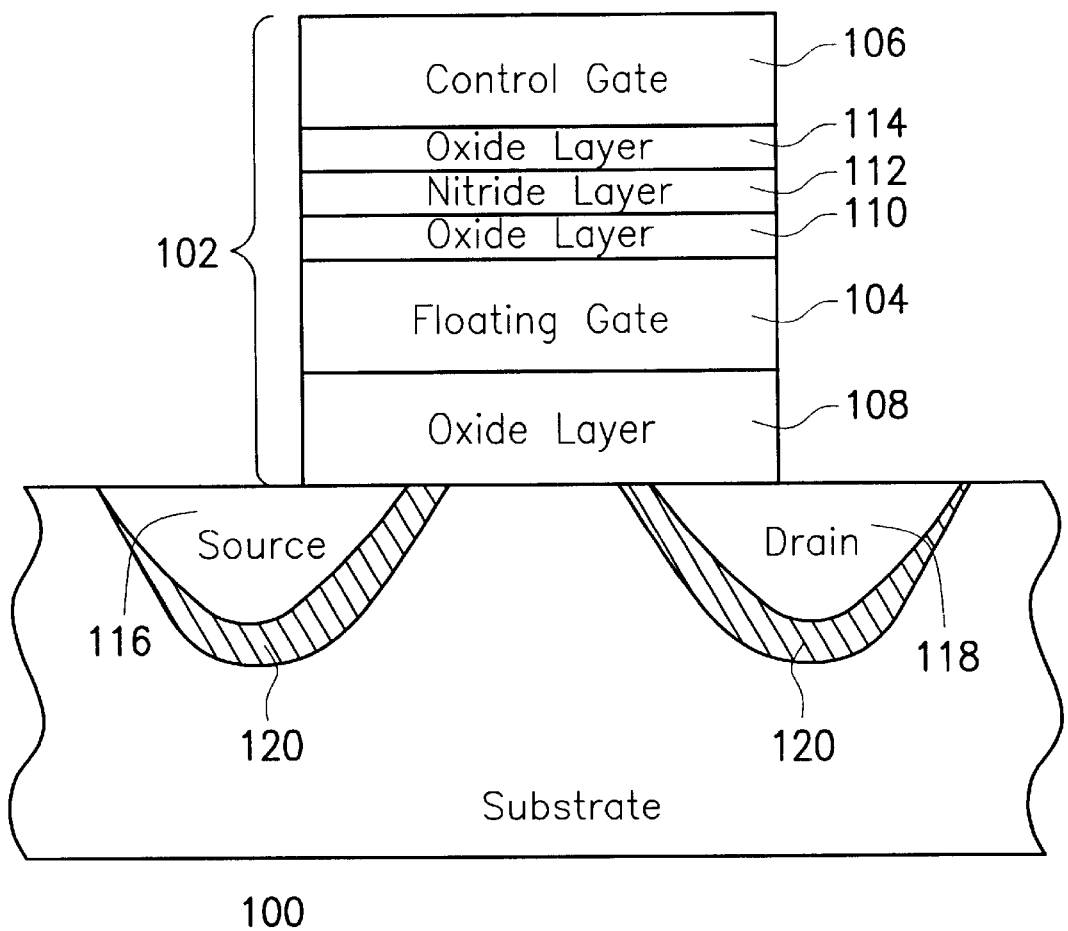
FIG. 1 is a cross-sectional view of a conventional memory cell of a flash memory device.
Figure 2:
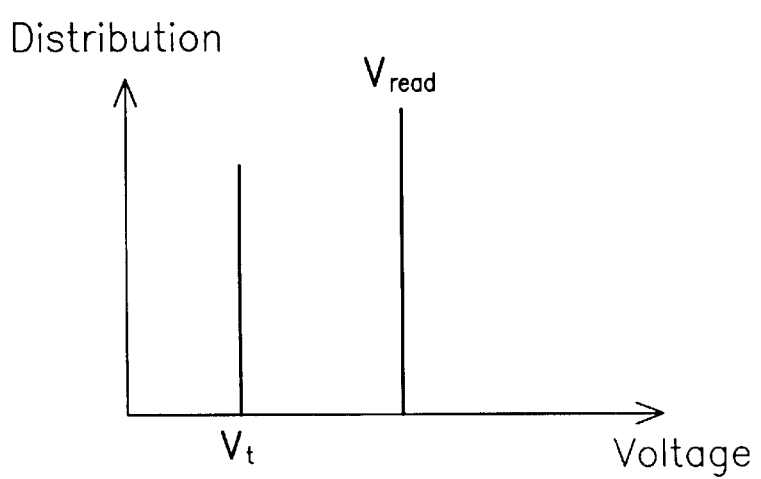
FIG. 2 illustrates the method for determining the logic state "0" and "1" of a memory cell.
Figure 3:
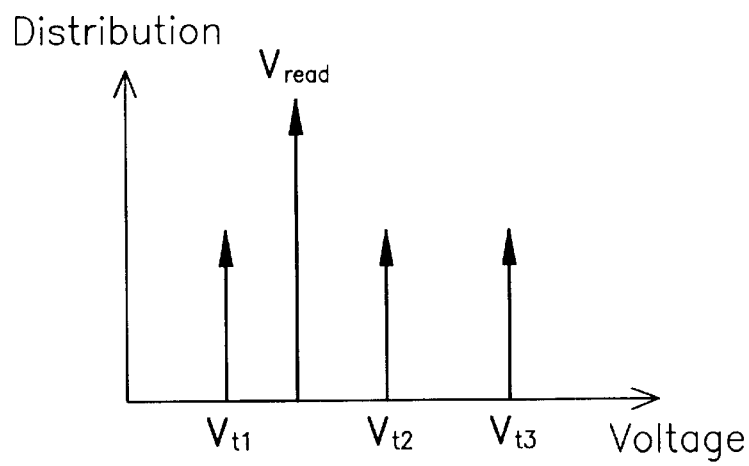
FIG. 3 illustrates the method for determining the four different logic states of a multi-level memory cell.
Figure 4:
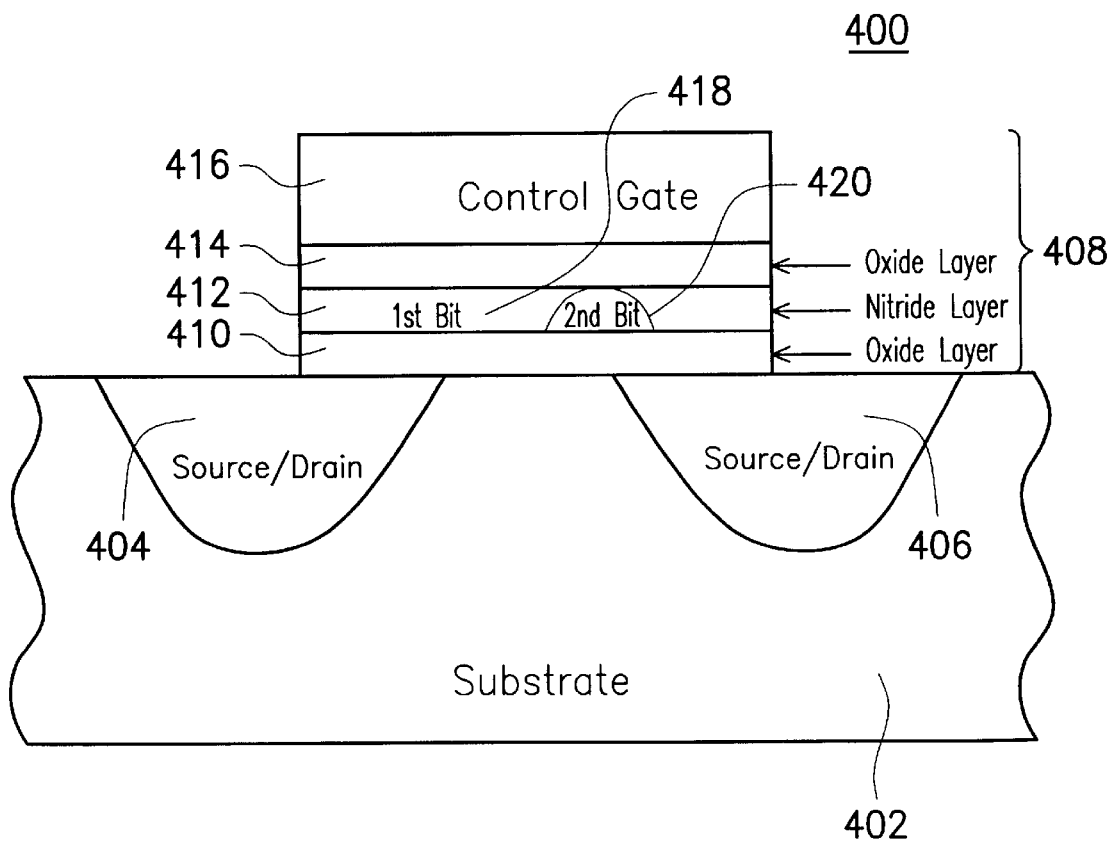
FIG. 4 is a cross-section view of a conventional NROM.
Figure 5:
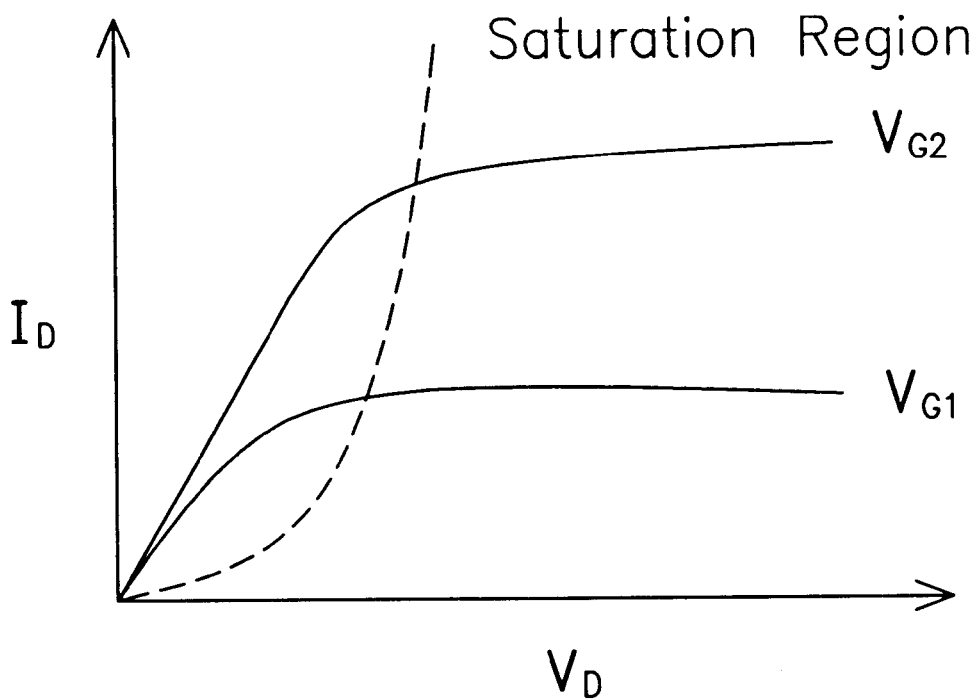
FIG. 5 is an $I_D$-$V_D$ curve for a typical MOS device.

Referring to FIG. 4, FIG. 4 is a cross-sectional view of a NROM. As shown in FIG. 4, the NROM 400 comprises a substrate 402, for example, a p-type substrate, a source/drain region 404 and a source/drain region 406, formed by implanting an N+ type dopants in the substrate 402. A gate structure 408 is formed on the substrate 402 between the source/drain region 404 and the source/drain region 406, wherein the gate structure 408 is formed with, sequentially from bottom to top, an oxide layer 410, a nitride layer 412, and oxide layer 414 and a polysilicon layer as the control gate 416. During the hot carrier programming, a high voltage is applied to the gate 408 and the source/drain region 406. Hot electrons would penetrate through the oxide layer 410 and become trap in the nitride layer 412 to form a charge trapping region in the nitride layer 412, for example, the region for trapping the second bit of memory 420.

Typically, the memory cell of a NROM 400 can store one bit of memory at each source/drain region 404 and source/drain region 406, in other words, the first bit 418 and the second bit 420. However, the programming/reading of the two bits of data must inverse read. Moreover, during the reading of one of the two bits of data, the current that travels through the source/drain region 404 and the source/drain region 406 is affected by the neighboring bit of memory. An electrical barrier is resulted due to the presence of the neighboring bit of memory. The electrical barrier lowers the high electrical current that supposedly travels through the source/drain region 404 and the source/drain region 406. Such an effect is known as the second bit effect of the electrical barrier.

The present invention takes advantage of the second bit effect of a NROM to achieve the programming of a multi-level memory. As the second bit in the NROM 400 is being programmed, due to the hot carrier effect, the electrical charges penetrate the oxide layer 410 and store in the charge-trapping region for the second bit of memory 420, forming a partial pulled high of the surface potential, in other words, an electrical barrier. During the reading of the first bit 418 of information, the source/drain region 404 is grounded and a suitable voltage is applied to the source/drain region 406. As a result, the electrical barrier of the second bit of memory 420 can alter the reading current of the first bit.

Therefore, as shown in FIG. 4, a high voltage is applied to the gate 408 and an appropriate bias is applied to the source/drain region 404 and the source/drain region 406 during the programming of a multi-level NROM memory cell. Electrical charges are then stored in the charge-trapping region of the second bit 420 of memory. Since the electrical charges that are trapped in the charge-trapping region vary, the electrical barrier is thus varies. During the reading of the multi-level NROM 400, an appropriate bias is applied to the source/drain region 404 and the source/drain region 406. Moreover, the voltage that is applied to the source/drain region 404 and the source/drain region 406 must be greater than the electrical barrier generated by the second bit effect in order to open up the MOS transistor for the current to flow through the source/drain region 404 and the source/drain region 406.

Figure 6:
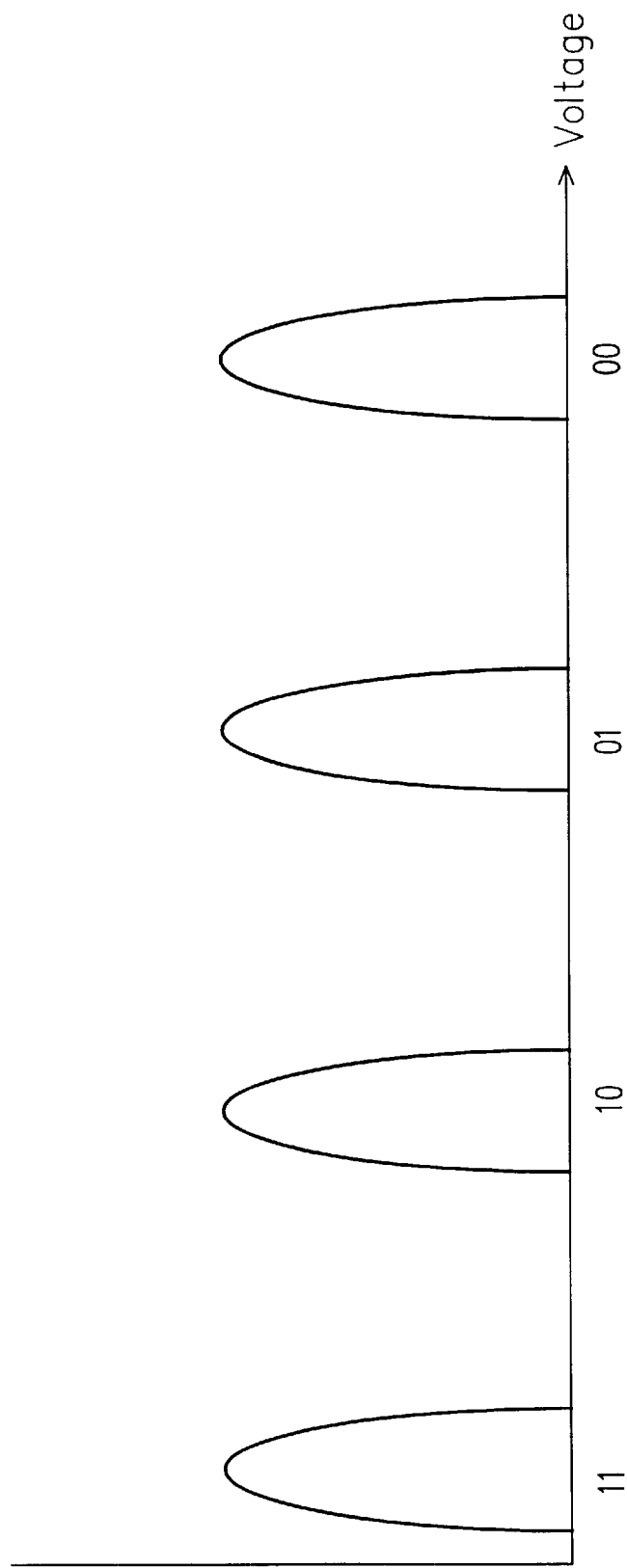
FIG. 6 is a diagram illustrating the different memory states of a multi-level NROM memory cell.

An appropriate bias is applied to the source/drain region 404, the source/drain region 406 and the gate 416, respectively to detect the current that flows between the source/drain region 404 and the source/drain region 406. Due to the different electrical barriers generated from the second bit effect, the electrical current that flows between the source/drain region 404 and the source/drain region 406 forms different levels of the threshold currents. The different threshold currents would thereby reveal the various states of the NROM 400. As shown in FIG. 6, the various memory states of the multi-level NROM memory cell is illustrated. A binary data of a 2-bit memory cell must have $2^2$ states, wherein each state (such as "11", "10", "01" and "00") must have a reference current level.

TABLE 1

| States | First Bit | Second Bit | Reading Current |
|---|---|---|---|
| 11 | Low | Low | I1 |
| 10 | Low | High Vt3 | I2 |
| 01 | Low | High Vt2 | I3 |
| 00 | High Vt1 | High/Low (Don't care) | I4 (0) |

Table 1 shows the voltage and the reading current of the first bit and the second bit of the NROM under various states. Referring to table 1 and FIG. 4, the first bit 418 and the second bit 420 have to be decided simultaneously when reading the NROM 400 under various states. When the state is "00", the first bit 418 is at a level of voltage Vt1 and the second bit 420 can be at any level of voltage. When the state is "01", only the second bit 420 reaches at a level Vt2. When the state is "10", only the second bit 420 reaches at a level Vt3. When the state is "11", the levels of first bit 418 and the second bit 420 are low. Therefore, when a biggest value of the reading current is measured to flow through between the source/drain region 404 and the source/drain region 406 (i.e. the reading current is I1 in table 1), a state stored in the NROM 400 can be determined as "11". As the reading current detected between the source/drain region 404 and the source/drain region 406 is detected to be the second largest current (reading current is I2 in the table 1), an "10" state is determined to be stored in the NROM 400.

Based on the foregoing, comparing the application of a conventional flash memory for a multi-level memory with the application of a NROM for multi-level memory, the formation of the gate for a NROM is simpler than that for a flash memory. Moreover, an additional implantation process at the vicinity of the source/drain region is obviated in a NROM. Only reading one side of the bit of the current flow between the source/drain region is sufficient to determine memory state of a NROM.

Accordingly, using a NROM as a multi-level memory cell not only simplifies the semiconductor processing, the semiconductor design and manufacturing costs are also lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory cell of a multi-level nitride read-only memory (NROM), wherein a nitride layer is formed and the nitride layer traps a plurality of electrical charges locally to form a plurality of charge-trapping regions, wherein the charge-trapping regions store electrical charges as bits of memory, the memory cell of the multi-level NROM comprises:

a first bit, wherein the first bit requires a threshold electrical current for reading the first bit; and a second bit, wherein the charges stored for the second bit form an electrical barrier, and the threshold electrical current for reading the first bit is affected by the electrical barrier, wherein a various size of the electrical barrier determines a various levels of the threshold electrical current, and each level of the threshold electrical current defines a different memory state of the memory cell of the multi-level NROM.

2. The memory cell of claim 1, further comprises:

a substrate;

a first source/drain region, formed in the substrate;

a second source/drain region, formed in the substrate; and a gate, formed on the substrate between the first source/drain region and the second source/drain region.

3. The memory cell of claim 2, wherein the gate comprises sequentially from bottom to top a first oxide layer, a nitride layer, a second oxide layer and a polysilicon layer.

4. The memory cell of claim 1, wherein the electrical barrier resulted from the second bit is a threshold voltage, in which the threshold voltage determines a required voltage to open up the memory cell of the multi-level NROM.

5. A method for operating a memory cell of a multi-level NROM, the memory cell is formed with a nitride layer and the nitride layer comprises a plurality of charge-trapping regions for storing charges of a first bit of memory and a second bit of memory, wherein an electrical barrier is formed by the stored charges of the second bit of memory, the method comprising:

defining a size of a threshold electrical current that flows between source/drain regions of the multi-level NROM during a read operation by a size of the electrical barrier; and defining a memory state of the memory cell of the multi-level NROM by the size of the threshold electrical current.

* * * * *